US012676589B2

(12) United States Patent (10) Patent No.: US 12,676,589 B2
Akiyama et al. (45) Date of Patent: Jul. 7, 2026

(54) COMPOSITE SUBSTRATE

(71) Applicant: Shin-Etsu Chemical Co., Ltd., Tokyo (JP)

(72) Inventors: Shoji Akiyama, Gunma (JP); Shozo Shirai, Gunma (JP); Masayuki Tanno, Gunma (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 18/370,612

(22) Filed: Sep. 20, 2023

(65) Prior Publication Data

US 2024/0022229 A1 Jan. 18, 2024

Related U.S. Application Data

(62) Division of application No. 16/475,528, filed as application No. PCT/JP2017/043767 on Dec. 6, 2017, now Pat. No. 11,804,818.

(30) Foreign Application Priority Data

Jan. 18, 2017 (JP) ................................ 2017-006351

(51) Int. Cl.
| | |
|---|---|
| *H03H 9/02* | (2006.01) |
| *H03H 3/02* | (2006.01) |
| *H03H 3/10* | (2006.01) |

(52) U.S. Cl.
CPC .......... *H03H 9/02574* (2013.01); *H03H 3/02* (2013.01); *H03H 3/10* (2013.01); *H03H 9/02559* (2013.01); *H03H 9/02834* (2013.01); *H03H 9/02897* (2013.01); *H03H 2003/028* (2013.01)

(58) Field of Classification Search
CPC ...... H03H 2003/028; H03H 3/02; H03H 3/10; H03H 9/02559; H03H 9/02574
USPC .......................................... 310/313; 29/25.35
See application file for complete search history.

(56) References Cited

U.S. PATENT DOCUMENTS

| | | | |
|---|---|---|---|
| 6,544,656 | B1 | 4/2003 | Abe et al. |
| 6,565,652 | B1 * | 5/2003 | Kononchuk ............ C30B 29/06 |
| | | | 117/30 |
| 11,804,818 | B2 * | 10/2023 | Akiyama ........... H03H 9/02834 |
| 2003/0075260 | A1 | 4/2003 | Mitani |
| 2004/0036381 | A1 | 2/2004 | Abbott et al. |
| 2004/0207485 | A1 | 10/2004 | Kawachi et al. |

(Continued)

FOREIGN PATENT DOCUMENTS

| | | | |
|---|---|---|---|
| CN | 103247566 | * | 4/2016 |
| JP | H8-10695 | B2 | 1/1996 |

(Continued)

OTHER PUBLICATIONS

ISR for PCT/JP2017/043767, dated Feb. 27, 2018 (w/ translation).

(Continued)

*Primary Examiner* — Minh N Trinh
(74) *Attorney, Agent, or Firm* — GREENBLUM & BERNSTEIN, P.L.C.

(57) ABSTRACT

A composite substrate that is obtained by bonding a silicon (Si) wafer having an interstitial oxygen concentration of 2 to 10 ppma to a piezoelectric material substrate as a support substrate, and thinning the piezoelectric material substrate after the bonding.

5 Claims, 7 Drawing Sheets

(56) References Cited

U.S. PATENT DOCUMENTS

| 2004/0226162 | A1 |  | 11/2004 | Miura et al. |  |
| 2010/0040893 | A1 |  | 2/2010 | Yagihashi et al. |  |
| 2015/0008789 | A1 |  | 1/2015 | Iwamoto |  |
| 2017/0222619 | A1 |  | 8/2017 | Iwamoto et al. |  |
| 2019/0386640 | A1 |  | 12/2019 | Akyama |  |
| 2024/0022229 | A1 | * | 1/2024 | Akiyama | H10N 30/073 |

FOREIGN PATENT DOCUMENTS

| JP |  | H9-246129 | A |  | 9/1997 |  |
| JP |  | 2002-184960 | A |  | 6/2002 |  |
| JP |  | 2004-304622 | A |  | 10/2004 |  |
| JP |  | 2010-45260 | A |  | 2/2010 |  |
| JP |  | 2011-236316 | A |  | 11/2011 |  |
| JP |  | 2015145054 |  | * | 8/2015 |  |
| WO | WO | 2004/006431 | A1 |  | 1/2004 |  |
| WO | WO | 2013/146374 | A1 |  | 10/2013 |  |
| WO | WO | 2016/084526 | A1 |  | 6/2016 |  |
| WO | WO-2017056376 | A1 | * | 4/2017 | H01L 21/02 |

OTHER PUBLICATIONS

IRP for PCT/JP2017/043767, dated Feb. 27, 2018 (w/ translation).
Taiyo Yuden Co., Ltd., "SAW-Duplexer Temperature Compensation Technology Used for RF Front End of Smartphone", Dempa Shimbun High Technology, Nov. 8, 2012 (w/ partial translation).
Edited by the UCS Society for Research on Basic Technology of Semiconductors, "Science of Silicon", Realize Science and Technology Center, Jun. 28, 1996, pp. 576-582 (w/ translation).
ESR for EP App. No. 17892974.1, dated Nov. 2, 2020.
Office Action for JP App. No. 2020-076868, dated Mar. 23, 2021 (w/ translation).
Office Action for CN App. No. 201780081147.X, dated Nov. 3, 2022 (w/ translation).
Office Action for KR App. No. 10-2019-7021403, dated Feb. 17, 2023 (w/ translation).

* cited by examiner

COMPOSITE SUBSTRATE

CROSS-REFERENCE TO RELATED APPLICATIONS

This is a Division of U.S. application Ser. No. 16/475,528, which is the U.S. National Stage entry of PCT/JP2017/043767, filed Dec. 6, 2017, which claims priority to JP Application No. 2017-006351, filed Jan. 18, 2017. The disclosure of each of the applications identified above is herein incorporated by reference in its entirety.

TECHNICAL FIELD

The present invention relates to a composite substrate used in a surface-acoustic-wave (SAW) device and the like, and a method of manufacturing the composite substrate.

BACKGROUND ART

In recent years, in the market of mobile communication typified by smartphones, the amount of communication has been rapidly increasing. In order to cope with this problem, it has become important to increase the number of necessary bands and inevitably miniaturize and improve the performance of various components.

Lithium tantalate (sometimes abbreviated as LT) and lithium niobate (sometimes abbreviated as LN), which are common piezoelectric materials, are widely used as materials for surface-acoustic-wave (SAW) devices. While these materials have a large electromechanical coupling coefficient and can be broadened, they have a problem that the temperature stability is low and the frequency that can be dealt with is shifted by a temperature change. This is because lithium tantalate and lithium niobate have very high thermal expansion coefficients.

In order to reduce this problem, a method has been proposed in which a material having a smaller thermal expansion coefficient, specifically sapphire, is bonded to lithium tantalate or lithium niobate, and a wafer of lithium tantalate or lithium niobate is thinned to several μm to several tens of μm by grinding or the like, thereby suppressing thermal expansion and improving temperature characteristics (for example, see Non-Patent Document 1). FIG. 5 is a graph showing thermal expansion coefficients of various materials in comparison. Among them, silicon has a small thermal expansion coefficient, is easily cleaved, has a high thermal conductivity, and is excellent in processability, and thus appears to be a balanced and excellent choice.

However, this method also has problems. Silicon (Si) is not an insulator like the other materials shown in FIG. 5 (quartz, sapphire, etc.). Therefore, when Si is used for a support substrate of a thinned piezoelectric material such as LT, a certain degree of dielectric loss occurs. This dielectric loss degrades characteristics such as the Q factor (resonance sharpness). In order to suppress the dielectric loss, it is necessary to increase the resistivity of the Si substrate as much as possible. In order to increase the resistivity of the Si substrate, it is important to reduce the amount of oxygen mixed into the Si crystal as much as possible in the manufacturing process. Ordinary Si is produced by the Czochralski method, in which single-crystal ingots are pulled from Si melted in quartz crucibles. At this time, it is difficult to completely prevent oxygen from entering from the quartz crucible.

For this reason, it seems that the FZ method (Floating Zone method) without using quartz crucibles for the growth is desirable in order to produce high resistivity Si. However, the FZ method has a problem that it is difficult to increase the diameter (150 mmΦ the maximum), and the productivity is low compared with the conventional CZ method. Moreover, not only the productivity of the manufacturing process, but also the problem of the supply that the polysilicon having a small amount of impurities in the material must be carefully selected greatly affects the overall productivity of the FZ method.

Several methods have been proposed to solve productivity problems (see, e.g., Patent Document 1). The method disclosed in Patent Document 1 uses the CZ method instead of the FZ method, which is a factor of low productivity. That is, by applying a magnetic field (Magnetic Field Applied CZ: MCZ method), convective flow of the melt is suppressed when growing the single-crystal silicon ingot, the mixing of oxygen from the quartz crucible is prevented as much as possible, and high resistivity is realized by precipitating the mixed dissolved oxygen by a special heat treatment. However, since a special heat treatment for promoting oxygen precipitation is required, it is difficult to fundamentally improve the productivity, although not as much as the FZ method.

In addition to the resistivity at room temperature, the need to maintain a high resistance even after a normal CMOS process (up to 1050° C.) is another reason why it is difficult to produce high-resistance wafers. In particular, a temperature range (400° C. to 600° C.) in which dissolved oxygen is said to be donor (thermal donor) to lower the resistivity can be said to be a dangerous temperature range which may cause the lowering of the resistivity in particular. Therefore, it is not easy to produce wafers that maintain high resistivity after the CMOS process.

There is also a more serious and fundamental problem than the resistivity problem. It is a problem of mechanical strength (or heat resistance) of Si itself. Since the difference between the expansion coefficients of LT and Si is extremely large in the LT/Si bonded wafers, if low-temperature heat treatment (e.g., 300° C.) is performed after the bonding, a shift of crystals called slip may occur in the Si substrate or the substrate itself may be cracked. FIGS. 6 and 7 show optical micrographs of the slip produced after heat treatment at 300° C. was performed on a wafer to which an LT (20 μm thick) and a high-resistance (>1000 Ωcm) FZ wafer (oxygen concentration is less than 1 ppma) were bonded. These photographs were obtained by observing a portion where the LT peeled off after the slip occurred, and FIG. 6 is a photograph in the vicinity of the outer periphery of the substrate, and FIG. 7 is a photograph in the vicinity of 5 mm from the outer periphery of the substrate. When the slip occurs, the LT around the slip peels off, and the substrate may be damaged. This is considered to be a big problem because a low oxygen concentration wafer is used.

As an important point with respect to the occurrence of the slip, it has been clarified that the yield stress increases by increasing the concentration of oxygen dissolved in the Si wafer to be used, "stickiness" occurs in the Si crystal (see, for example, Non-Patent Document 2), and the slip (dislocation) hardly occurs.

That is, while it is necessary to reduce dissolved oxygen in order to increase the resistivity in order to suppress the dielectric loss, it is necessary to increase dissolved oxygen in order to suppress the problem of mechanical strength.

In this specification, the method of measuring dissolved oxygen was based on JEIDA-61-2000, which is a standard measurement method of atomic concentrations of interstitial oxygen using infrared. This technique measures the 1106 cm$^{-1}$, which is an absorption peak characteristic of interstitial oxygen. A JIR-6500 Fourier Transform Infrared Spectrometer (FT-IR) manufactured by JEOL Ltd. was used as a measuring device. The obtained absorption coefficient $\alpha$ multiplied by a coefficient 6.28 is the interstitial oxygen concentration (ppma). In this specification, the interstitial oxygen concentration obtained by this method is simply referred to as "oxygen concentration".

PRIOR ART REFERENCES

Patent Documents

Patent Document 1: U.S. Pat. No. 6,544,656

Non Patent Documents

Non-Patent Document 1: Taiyo Yuden Co., Ltd. "Temperature Compensation Technology for SAW-Duplexer Used in RF Front End of Smartphone", Dempa Shimbun High Technology, November 2012

Non-Patent Document 2: Edited by the UCS Society for Research on Basic Technology of Semiconductors, "Science of Silicon," Realize Science and Technology Center, Jun. 28, 1996, p. 576-582

SUMMARY OF THE INVENTION

Problems to be Solved by the Invention

It is an object of the present invention to provide a composite substrate and a method of manufacturing the composite substrate which can maintain high resistance after processing at 300° C.

Means of Solving the Problems

In order to concurrently solve the problems of dielectric losses and mechanical strength that occur when Si is used as a support substrate, the present inventors have focused on manufacturing processes of LT-SAW devices including LT/Si bonded substrates. SAW devices such as LTs and LT/Si do not require high-temperature processes (e.g., gate-oxidation) like semiconductor CMOS processes, and the maximum temperature is about 300° C. If a high resistance is maintained up to this temperature, no problem arises in terms of characteristics. Therefore, the idea of using a Si substrate capable of maintaining high resistance up to about 300° C. as a support substrate has been reached. From this point of view, it can be said that this purpose is met even if the oxygen concentration is somewhat high. That is, in the application to LT-SAW devices, whether or not the high resistivity can be maintained after processing at 300° C. is a very significant criterion for judging whether or not Si substrate can be adopted.

In order to solve the above problems, a composite substrate according to the present invention is manufactured by bonding a silicon (Si) wafer having an interstitial oxygen concentration of 2 to 10 ppma as a support substrate to a piezoelectric material substrate, and thinning the piezoelectric material substrate after the bonding.

In the present invention, the piezoelectric material substrate may be a lithium tantalate wafer (LT) substrate or a lithium niobate (LN) substrate. The silicon wafer may be cut out from a crystal produced by any of the FZ method, the MCZ method, and the CZ method.

In the present invention, the composite substrate may have an intervening layer between the piezoelectric material substrate and the silicon wafer. The intervening layers may include any of silicon oxide, silicon nitride, silicon oxynitride (SiON), and amorphous silicon. The intervening layer may be thermally oxidized silica. The intervening layer may be formed by chemical vapor deposition (CVD) or physical vapor deposition (PVD), or may be formed by applying a silicone-based oil. When the intervening layer is formed by applying a silicone-based oil, the oil may contain perhydropolysilazane or methyltrimethoxysilane. By providing such an intervening layer, the bonding strength can be increased and peeling can be suppressed.

In the present invention, one or both of the piezoelectric material substrate and the silicon wafer may be subjected to surface activation treatment before bonding. In this case, the surface activation treatment may be performed using a vacuum ion beam or a plasma activation method. These surface activation treatments can increase the bonding strength.

In order to solve the above problems, a method of manufacturing a composite substrate according to the present invention includes a step of preparing a piezoelectric material substrate, a step of preparing a silicon (Si) wafer having an interstitial oxygen concentration of 2 to 10 ppma as a support substrate, a step of bonding the piezoelectric material substrate and the silicon wafer, and a step of thinning the piezoelectric material substrate after the bonding step.

In the present invention, the piezoelectric material substrate may be a lithium tantalate wafer (LT) substrate or a lithium niobate (LN) substrate. The silicon wafer may be cut out from a crystal produced by any of the FZ method, the MCZ method, and the CZ method.

The present invention may further include a step of providing an intervening layer on either or both of the surface of the piezoelectric material substrate and the silicon wafer prior to the step of bonding. The intervening layer may include any one of a silicon oxide, a silicon nitride, a silicon oxynitride (SiON), and amorphous silicon. In the step of providing the intervening layer, the silicon wafer may be thermally oxidized. In the step of providing the intervening layer, the intervening layer may be formed by chemical vapor deposition (CVD) or physical vapor deposition (PVD). In the step of providing the intervening layer, the intervening layer may be formed by applying a silicone-based oil. In this case, the silicone-based oil may contain perhydropolysilazane or methyltrimethoxysilane.

The present invention may further include a step of performing surface activation treatment on one or both of the piezoelectric material substrate and the silicon wafer before the step of bonding. The surface activation treatment may be performed using a vacuum ion beam or a plasma activation method. These surface activation treatments can increase the bonding strength.

DESCRIPTION OF EMBODIMENTS

Figure 1:
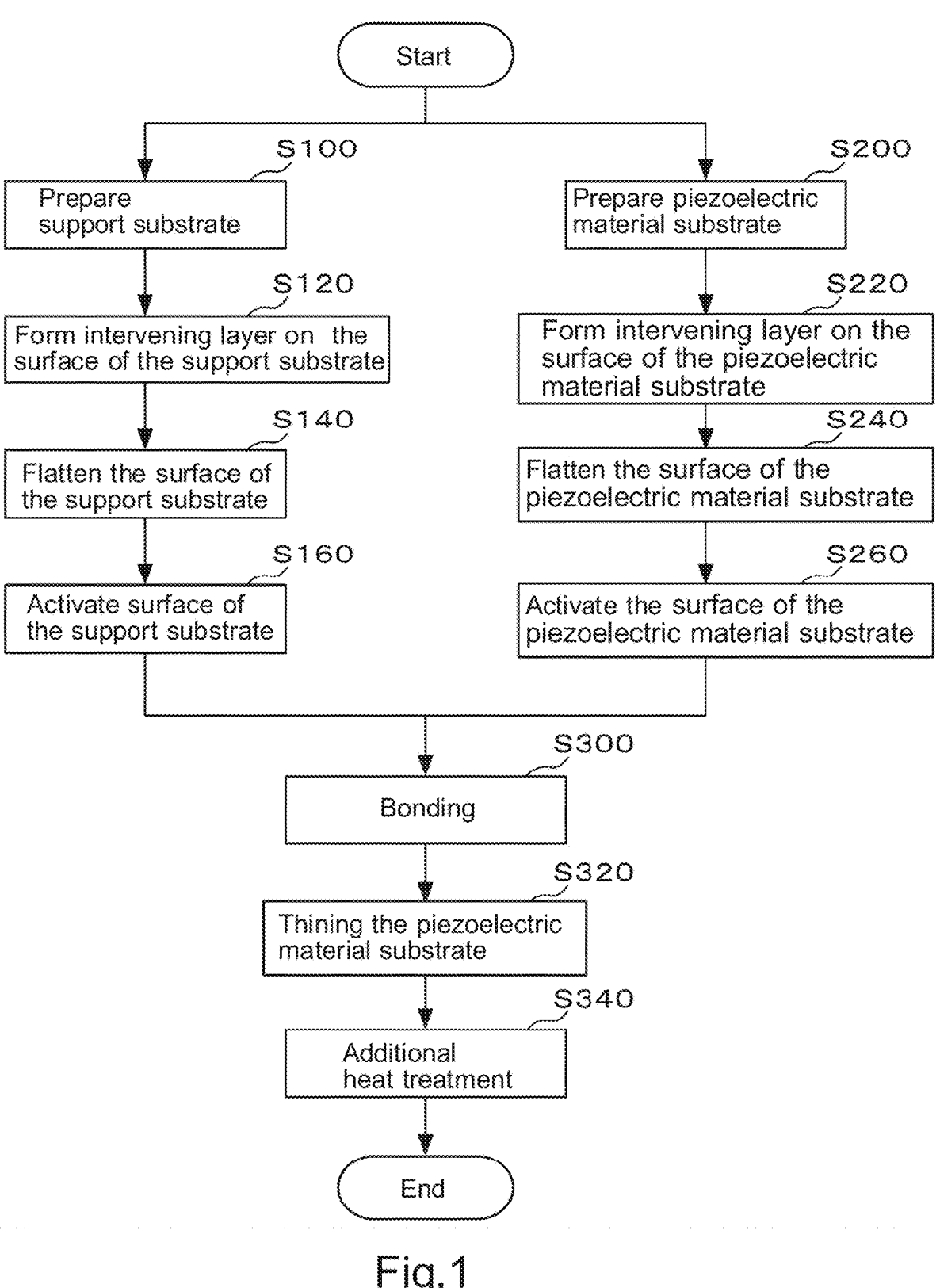
FIG. 1 is a flowchart of the manufacturing process of the composite substrate according to the present embodiment.

The composite substrate 1 of the present embodiment is manufactured through a process in which the support substrate 10 and the piezoelectric material substrate 20 are respectively subjected to processing before bonding as necessary, and then the substrates are bonded together. Hereinafter, the manufacturing method will be described with reference to the flowchart shown in FIG. 1.

[Treatment of Support Substrate]

First, support substrate 10 is prepared (step S100). As the support substrate 10, a silicon (Si) wafer having an interstitial oxygen concentration of 2 to 10 ppma is used. The Si wafer used as the support substrate 10 is cut out from a single crystal ingot of Si manufactured by the FZ method, the MCZ method, or the CZ method.

Next, as required, intervening layer 31 is formed on the surface of the support substrates 10 (step S120). The material of the intervening layer 31 may include any of a silicon oxide, a silicon nitride, silicon oxynitride (SiON), and amorphous silicon. The intervening layer 31 can be formed, for example, as a film of thermally oxidized silica obtained by thermally oxidizing a Si wafer. Thermally oxidized silica is grown at a high temperature, so that it is dense, has few impurities, and can absorb a certain amount of gas. The intervening layer 31 may be formed by other methods. For example, the intervening layer 31 may be formed of a material suitable as an intervening layer by chemical vapor deposition (CVD) such as plasma enhanced CVD (Chemical Vapor Deposition). The intervening layer 31 may be formed of a material suitable for the intervening layer by physical vapor deposition (PVD). Alternatively, the intervening layer 31 may be formed by applying a silicone-based oil. The silicone-based oil to be applied may contain perhydropolysilazane or methyltrimethoxysilane. The silicone-based oil may be applied by spin coating.

Subsequently, the surface of the support substrate 10 to be bonded to the piezoelectric material substrate 20 is flattened as required (step S140). The degree of flattening is preferably such that the surface roughness is 0.3 nm or less in Ra. The flattening may be performed by chemical mechanical polishing. When the intervening layer 31 is not provided on the support substrate 10, the support substrate 10 itself is flattened. When the intervening layer 31 is provided on the support substrate 10, the surface of the intervening layer 31 is flattened. When the intervening layer 31 is provided, the characteristics of the composite substrate 1 do not depend on the initial surface roughness of the support substrate 10 to be a base. For example, the initial surface roughness of the support substrate 10 may be 150 nm or more in Ra.

In addition, as described as "if necessary", when a sufficiently flat surface is obtained without the flattening step, the flattening step may be omitted. For example, when the intervening layer 31 is formed by thermal oxidation using the support substrate 10 whose surface is finished as a mirror surface, the surface of the intervening layer 31 also becomes a mirror surface like the base, and therefore this flattening step is unnecessary.

Further, in order to increase the bonding strength at the time of bonding, an activation treatment is performed on the surface to be bonded (i.e., the surface of the support substrate 10 when the intervening layer 31 is not provided, or the surface of the intervening layer 31 when the intervening layer 31 is provided) as required (step S160). The surface activation treatment may be, for example, any of ozone water treatment, UV ozone treatment, ion beam treatment, and plasma treatment.

As described above, the processing before bonding to the support substrate 10 is completed.

[Processing of Piezoelectric Material Substrate]

First, the piezoelectric material substrate 20 is prepared (step S200). The piezoelectric material substrate 20 is a substrate of a piezoelectric material such as lithium tantalate (LT) or lithium niobate (LN), and is preferably a single crystal substrate of these piezoelectric material.

Next, as required, intervening layer 32 is formed on the surface of the piezoelectric material substrates 20 (step S220). The material of the intervening layer 32 may include any of a silicon oxide, a silicon nitride, silicon oxynitride (SiON), and amorphous silicon. The intervening layer 32 can be formed by the following method. That is, the intervening layer 32 may be formed by depositing a suitable material as the intervening layer by chemical vapor deposition (CVD) such as plasma CVD. The intervening layer 32 may be formed by depositing a suitable material as the intervening layer by physical vapor deposition (PVD). Alternatively, the intervening layer 32 may be formed by applying a silicone-based oil. The silicone-based oil to be applied may contain perhydropolysilazane or methyltrimethoxysilane. The silicone-based oil may be applied by spin coating.

Subsequently, the surfaces to be bonded to the support substrate 10 is flattened as required (step S240). The degree of flattening is preferably such that the surface roughness is 0.3 nm or less in Ra (arithmetic mean roughness). The flattening may be performed by chemical mechanical polishing. When the intervening layer 32 is not provided on the piezoelectric material substrate 20, the piezoelectric material substrate 20 itself is flattened. When the intervening layer 32 is provided on the piezoelectric material substrate 20, the surface of the intervening layer 32 is flattened. When the intervening layer 32 is provided, the characteristics of the composite substrate 1 do not depend on the initial surface roughness of the piezoelectric material substrate 20 to be a base. For example, the initial surface roughness of the piezoelectric material substrate 20 may be 150 nm or more in Ra.

Further, in order to increase the bonding strength at the time of bonding, an activation treatment is performed on the surface to be bonded (i.e., the surface of the piezoelectric material substrate 20 when the intervening layer 32 is not provided, or the surface of the intervening layer 32 when the intervening layer 31 is provided) as required (step S260). The surface activation treatment may be, for example, ozone water treatment, UV ozone treatment, ion beam treatment (e.g., vacuum ion beam treatment), or plasma treatment.

As described above, the processing before the bonding to the piezoelectric material substrate 20 is completed.

[Pasting and Subsequent Processing]

The support substrate 10 and the piezoelectric material substrate 20 treated as described above are bonded to each piezoelectric material substrate are described, the same effect can be obtained by using a lithium niobate (LN) wafer instead of the LT wafer.

Example 1

Ten types of 150 mmΦ Si wafers (thickness: 625 μm, P-type, resistivity: around 1100 Ωcm) were prepared, and 150 mmΦ LT wafers (thickness: 250 μm) were bonded together. Table 1 shows the manufacturing method of the single crystal ingot and the oxygen concentration of each of the 10 types of prepared Si wafers. Note that the type of the wafer is represented by a combination of a method for manufacturing a single crystal ingot and a numerical value of an oxygen concentration. For example, 1 ppma wafers produced by the FZ-method were described as "FZ1".

TABLE 1

| Wafer type | FZ0 | FZ1 | FZ2 | MCZ2 | MCZ5 | MCZ10 | MCZ12 | CZ10 | CZ12 | CZ15 |
|---|---|---|---|---|---|---|---|---|---|---|
| Method of manufacturing ingot | FZ | FZ | FZ | MCZ | MCZ | MCZ | MCZ | CZ | CZ | CZ |
| Oxygen concentration (ppma) | ~0 | 1 | 2 | 2 | 5 | 10 | 12 | 10 | 12 | 15 | other (step S300). In this case, the bonding strength may be increased by heating to a low temperature. The heating temperature at this low temperature may be, for example, about 100° C., and the heating time may be about 24 hours.

Subsequently, if desired, the piezoelectric material substrate 20 is grinded and polished to be thinned (step S320). For example, the thickness of the piezoelectric material substrate 20 is reduced to about 20 μm. Additional heat treatment may then be performed as required to enhance the bonding (step S340).

According to the manufacturing method described above, the composite substrate 1 in which the piezoelectric material substrate 20 and the support substrate 10 are bonded to each It was confirmed that the surface roughness of each of the Si wafer and the LT wafer to be bonded was 0.3 nm or less in Ra (arithmetic mean roughness). The bonding was performed by a room temperature bonding method using a vacuum ion beam. After bonding, the LT wafer was thinned to 20 μm by grinding and polishing. The wafer of the composite substrate thus bonded was reciprocated 10 times between a hot plate at 300° C. and a cooling stage, and thereafter, the occurrence of the slip and the state of cracking of the wafer were observed. The test results are shown in Table 2. From these results, it was found that the generation of the slip and wafer cracking can be prevented if the oxygen concentration of the Si wafer is 2 ppma or more. Similar results were obtained when LN was used instead of LT in the same experiment.

TABLE 2

Figure 2:
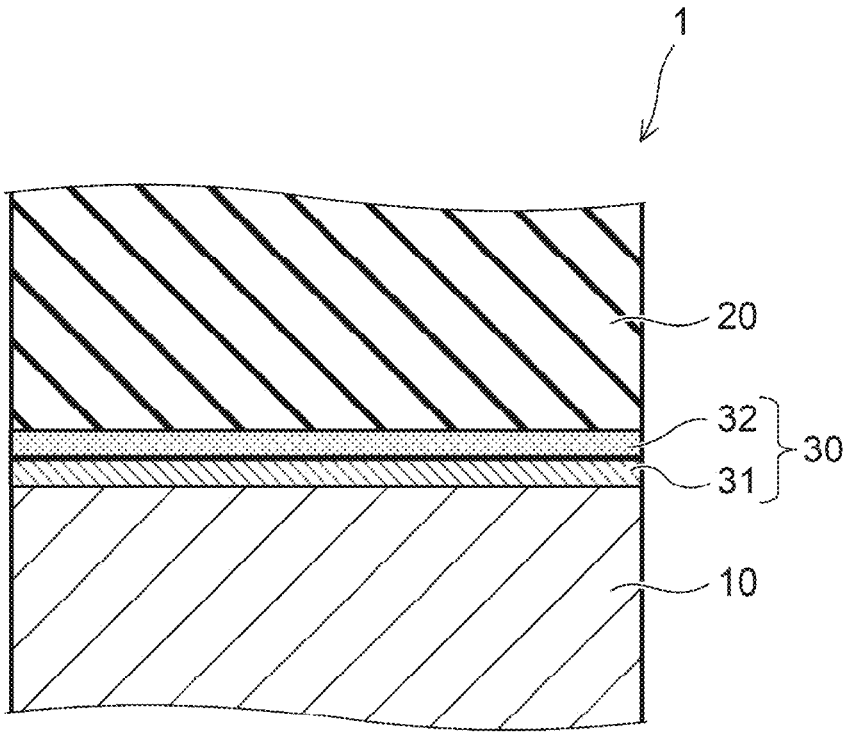
FIG. 2 is a schematic cross-sectional view illustrating a composite substrate according to the present embodiment.

| Wafer type | FZ0 | FZ1 | FZ2 | MCZ2 | MCZ5 | MCZ10 | MCZ12 | CZ10 | CZ12 | CZ15 |
|---|---|---|---|---|---|---|---|---|---|---|
| Slip occurrence | 2nd time | 6th time | None | None | None | None | None | None | None | None |
| Wafer cracking | 9th time | 6th time | None | None | None | None | None | None | None | None | other can be manufactured. FIG. 2 is a schematic cross-sectional view of the composite substrate 1 according to the present embodiment. In the composite substrate 1, the intervening layer 31 provided on the support substrate 10 and/or the intervening layer 32 provided on the piezoelectric material substrate 20 become the intervening layer 30 sandwiched between the piezoelectric material substrate 20 and the support substrate 10.

EXAMPLES

Hereinafter, examples performed to confirm the effects of the present invention will be described. Although examples in which a lithium tantalate (LT) wafer is mainly used as the

Example 2

Figure 3:
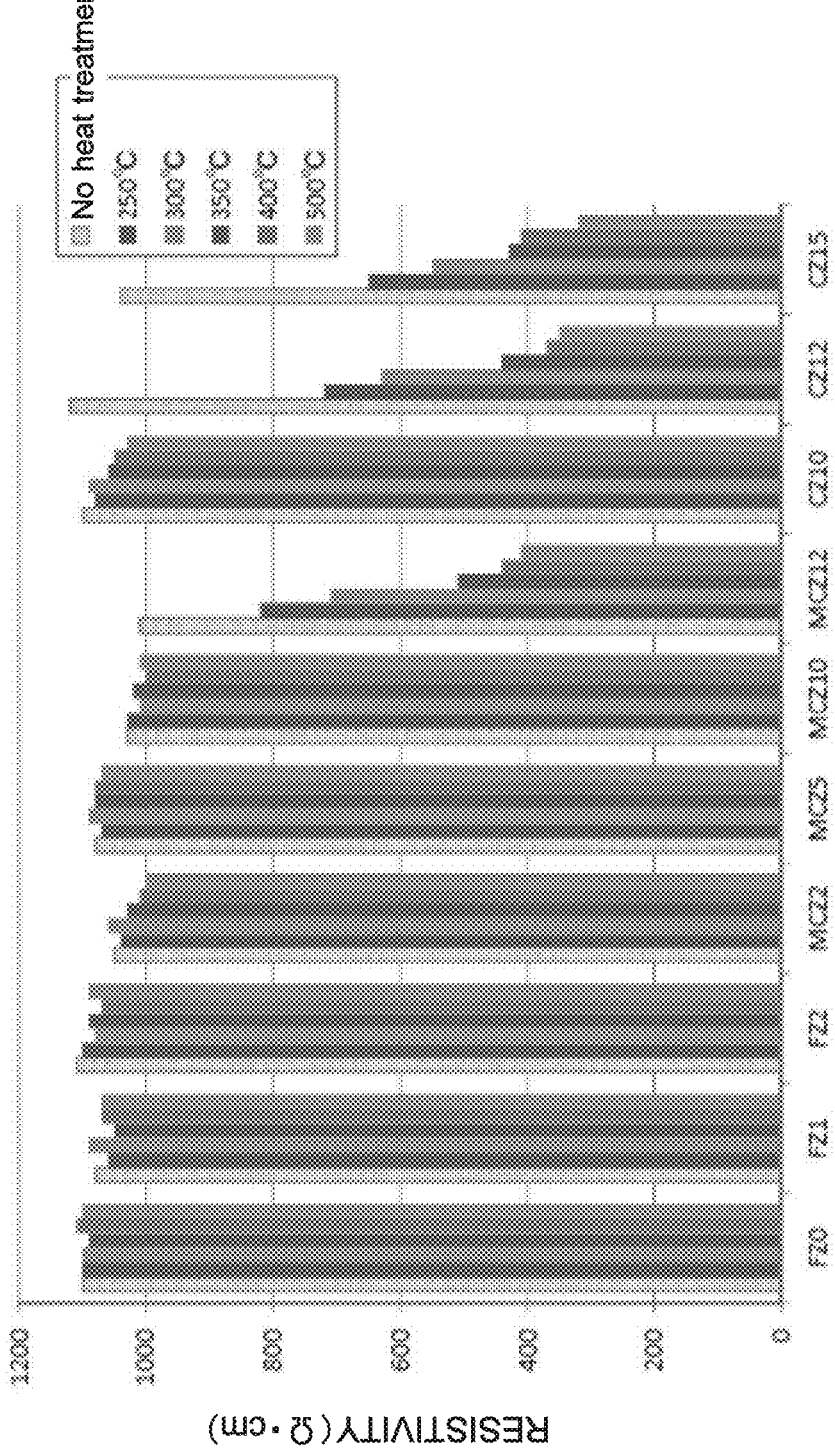
FIG. 3 is a graph showing the results of Example 2.

Ten types of Si wafers were prepared in the same manner as in Example 1, and heat treatment was performed at 250° C., 300° C., 350° C., 400° C., 450° C., and 500° C. for 1 hour in a nitrogen atmosphere. The results of measurement of resistivity before and after heat treatment are shown in Table 3 and FIG. 3. As a result, it was found that, when the oxygen concentration of the Si wafer was 10 ppma or less, there was little change in resistivity even when heat treatment was performed up to 350° C., which is considered to be the maximum temperature of the LT device manufacturing process, regardless of the manufacturing method of the Si single crystal ingot.

TABLE 3

| Wafer type | FZ0 | FZ1 | FZ2 | MCZ2 | MCZ5 | MCZ10 | MCZ12 | CZ10 | CZ12 | CZ15 |
|---|---|---|---|---|---|---|---|---|---|---|
| No heat treatment | 1100 | 1080 | 1110 | 1050 | 1080 | 1030 | 1010 | 1100 | 1120 | 1040 |
| 250° C. | 1100 | 1060 | 1100 | 1040 | 1070 | 1030 | 820 | 1080 | 720 | 650 |
| 300° C. | 1100 | 1090 | 1080 | 1060 | 1090 | 1010 | 710 | 1090 | 630 | 550 |
| 350° C. | 1090 | 1050 | 1090 | 1030 | 1080 | 1020 | 510 | 1060 | 440 | 430 |
| 400° C. | 1110 | 1070 | 1070 | 1010 | 1080 | 1000 | 440 | 1050 | 370 | 410 |
| 500° C. | 1100 | 1070 | 1090 | 1000 | 1070 | 1010 | 410 | 1030 | 350 | 320 |

Example 3

Figure 4:
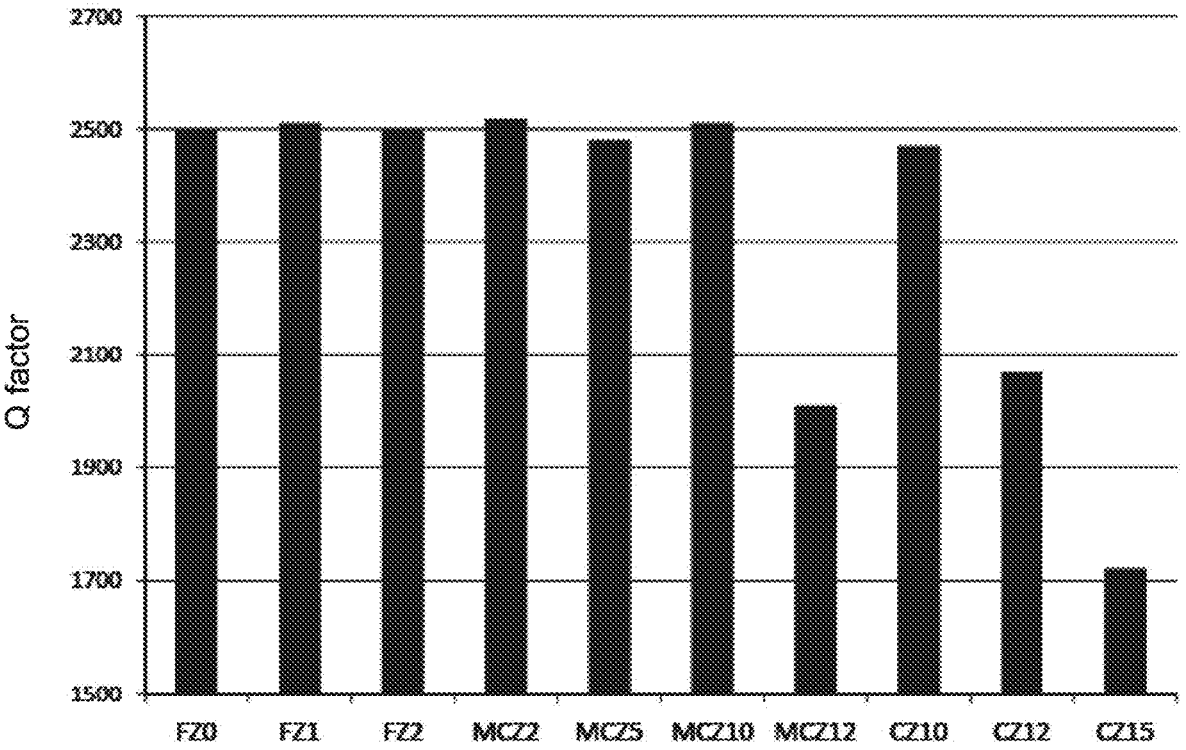
FIG. 4 is a graph showing the results of Example 3.
Figure 5:
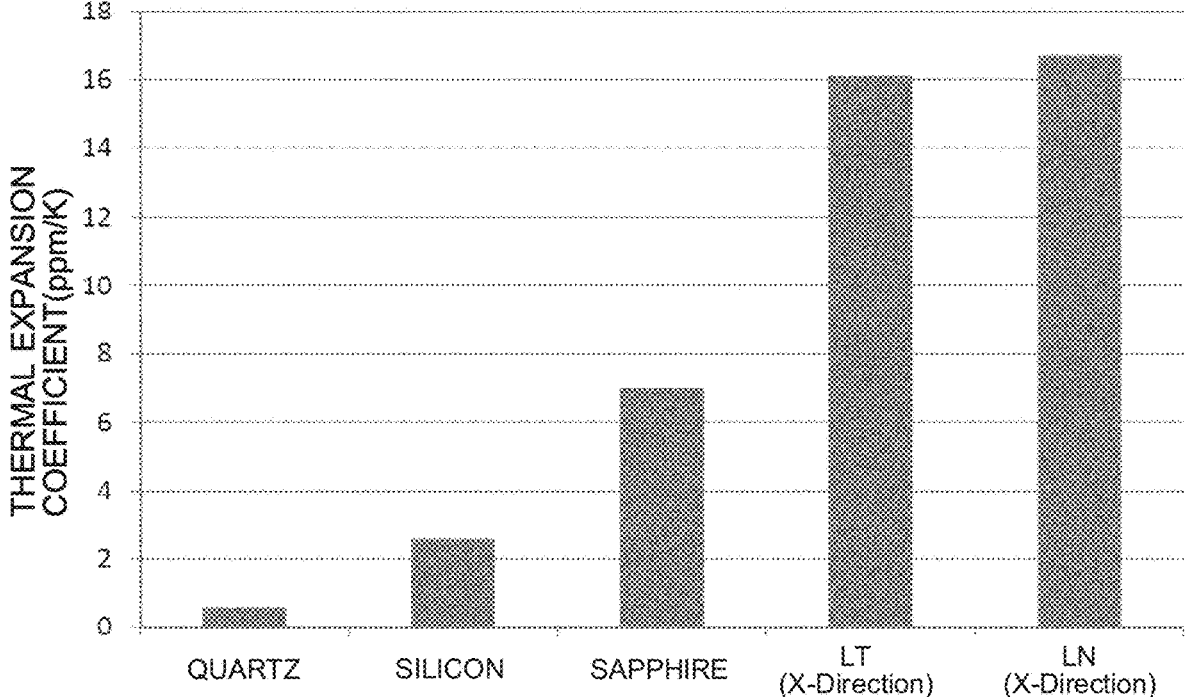
FIG. 5 is a graph showing thermal expansion coefficients of various materials in comparison.
Figure 6:
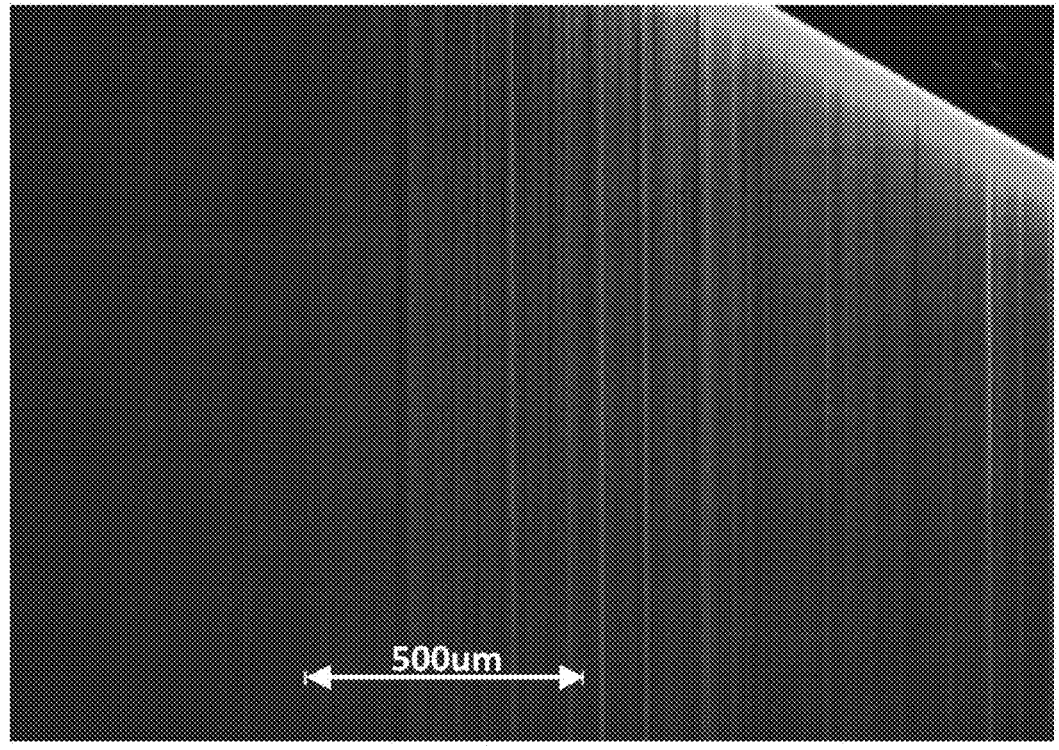
FIG. 6 is an optical micrograph of a slip generated after heat treatment in the vicinity of the outer periphery of a Si substrate.
Figure 7:
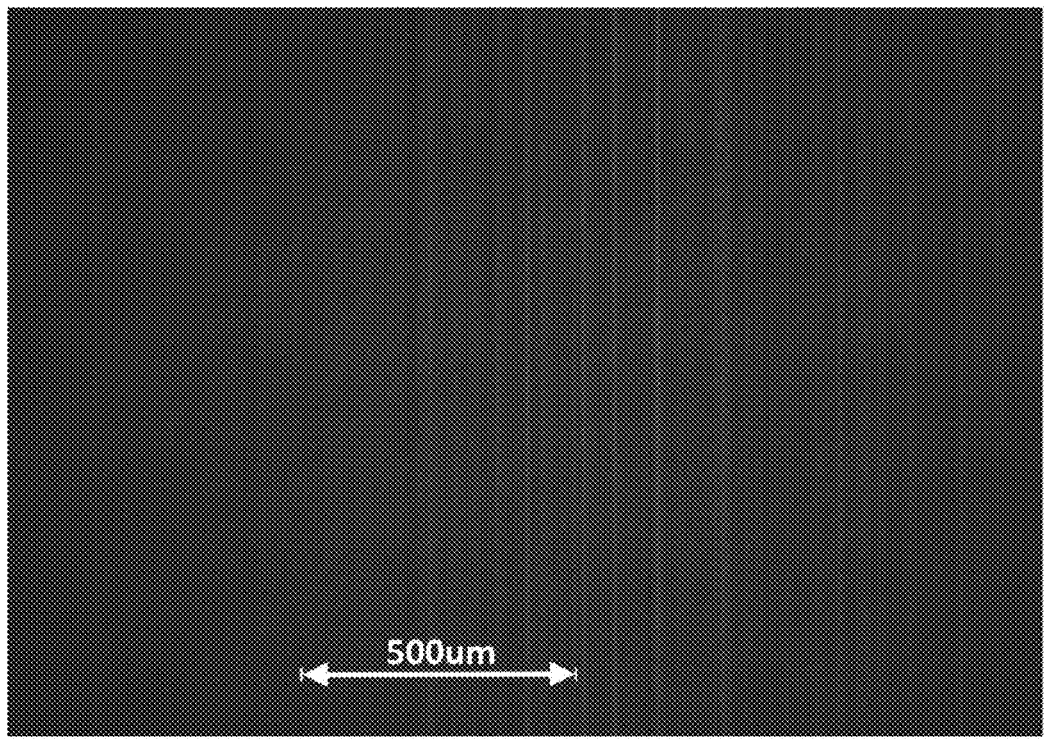
FIG. 7 is an optical micrograph of a slip generated after heat treatment in the vicinity of 5 mm from the outer periphery of the Si substrate.

A resonator was produced using the wafers of the 10 kinds of composite substrates obtained in Example 1, and the Q factor was measured. The maximum temperature of the manufacturing process of the resonator, which is an LT device, is about 350° C. For broken wafers, devices are manufactured and measured using surviving portion (i.e., a portion having a size sufficient for manufacturing a device), and for slipped wafers, devices are manufactured and measured using non-slipped portion. The measurement results of the Q factors are shown in Table 4 and FIG. 4. From this result, no deterioration in characteristics was observed for Si wafers having an oxygen concentration of 10 ppma or less, and deterioration in characteristics was observed for Si wafers having an oxygen concentration greater than 10 ppma. This result was found to be consistent with the change in resistivity in Example 2.

TABLE 4

| Wafer type | FZ0 | FZ1 | FZ2 | MCZ2 | MCZ5 | MCZ10 | MCZ12 | CZ10 | CZ12 | CZ15 |
|---|---|---|---|---|---|---|---|---|---|---|
| Q factor | 2500 | 2510 | 2500 | 2520 | 2480 | 2510 | 2010 | 2470 | 2070 | 1720 |

Example 4

Ten types of 150 mmΦ Si wafers having a thickness of 625 μm were prepared in the same manner as in Example 1, and a thermal oxide film having a thickness of 100 nm was grown. The thermal oxidation conditions are input at 700° C. and dry oxidation at 1000° C. LT wafers having a thickness of 250 μm and a diameter of 150 mmΦ was prepared. Surface activation was performed on both the Si wafer on which the thermal oxide film was grown and the LT wafer by plasma activation, and both wafers were bonded to each other. After the bonding, heat treatment was performed at 100° C. for 24 hours. It was confirmed that the surface roughness of each wafer before bonding was 0.3 nm or less in Ra.

After bonding and heat treatment, the LT wafer was thinned to 20 μm by grinding and polishing. These wafers were reciprocated 10 times between a hot plate at 300° C. and a cooling stage, and then slip generation and crack state of the wafers were observed. The results are provided in Table 5. From this result, it was found that the generation of the slip and the cracking of the wafer can be prevented if the oxygen concentration of the Si wafer is equal to or higher than the 2 ppma oxygen concentration. This result was almost the same as that of Example 1 embodiment, and it was found that generation of the slip and wafer cracking depend on the oxygen concentration of the Si wafer regardless of the presence or absence of the thermal oxide film, and that it is important that the oxygen concentration is 2 ppma or more.

TABLE 5

| Wafer type | FZ0 | FZ1 | FZ2 | MCZ2 | MCZ5 | MCZ10 | MCZ12 | CZ10 | CZ12 | CZ15 |
|---|---|---|---|---|---|---|---|---|---|---|
| Slip occurrence | 4th time | 8th time | None | None | None | None | None | None | None | None |
| Wafer cracking | 8th time | 10th time | None | None | None | None | None | None | None | None |

Example 5

Ten types of Si wafers were prepared in the same manner as in Example 1, and thermal oxidation was performed in the same manner as in Example 4. With respect to the Si wafer provided with the thermal oxide film in this manner, the conditions of the additional heat treatment were changed, and the resistivity before and after the additional heat treatment was measured. The conditions of the additional heat treatment were six types, i.e., no additional heat treatment, 250° C., 300° C., 350° C., 400° C., and 500° C., and the additional heat treatment was performed in a nitrogen atmosphere for 1 hour. The resistivity was measured before and after the additional heat treatment. The result of the measurement was almost the same as that of Example 2, and it was found that, when the oxygen concentration was 10 ppma or less, there was almost no change in resistivity even when heat treatment was performed up to 350° C. It has been found that even when a Si wafer provided with a thermal oxide film is used, it can be used without problems such as a decrease in resistivity by avoiding the treatment in the thermal donor generation temperature range (400 to 600° C.).

Example 6

Ten types of 150 mmΦ Si wafers having a thickness of 625 μm were prepared in the same manner as in Example 1, and a plasma CVD oxide film having a thickness of 200 nm was deposited around room temperature. After the oxide film was deposited, polishing for mirroring was performed. LT wafers having a thickness of 250 μm and a diameter of 150 mmΦ was prepared. Surface activation was performed on both the Si wafer on which the oxide film was deposited and the LT wafer by plasma activation, and both wafers were bonded to each other. After the bonding, heat treatment was performed at 100° C. for 24 hours. It was confirmed that the surface roughness of both wafers before bonding was 0.3 nm or less in Ra. As a result of conducting the same heat resistance experiment as in Example 1, the same tendency as in Example 1 was exhibited. From this result, it was found that the effect of the present invention can be obtained without depending on the method of forming the oxide film.

Example 7

Ten types of 150 mmΦ Si wafers (thickness: 625 μm) and 150 mmΦ LT wafers (thickness: 250 μm) were prepared in the same manner as in Example 1, and a plasma CVD oxide film of 200 nm was deposited on the LT wafer in the vicinity of room temperature. After deposition, polishing for mirroring was performed. Both the Si wafer and the LT wafer on which the oxide film was deposited were subjected to surface activation by plasma activation, and both wafers were bonded to each other. After the bonding, heat treatment was performed at 100° C. for 24 hours. It was confirmed that the surface roughness of both wafers before bonding was 0.3 nm or less in Ra. The same heat resistance experiment as in Example 1 was performed, and the results showed exactly the same tendency as in Example 1. From this result, it was found that the effect of the present invention can be obtained regardless of the position where the oxide film is formed, i.e., whether the intervening layer such as the oxide film is provided on the Si wafer or the LT wafer.

Example 8

Ten types of 150 mmΦ Si wafers (thickness: 625 μm) and 150 mmΦ LT wafers (thickness: 250 μm) with rough surfaces (Ra=160 nm) were prepared in the same manner as in Example 1, and 5 μm plasma CVD oxide films were deposited on the LT wafers around room temperature. After deposition, polishing for mirroring was performed. Both the Si wafer and the LT wafer on which the oxide film was deposited were subjected to surface activation by plasma activation, and both wafers were bonded to each other. After the bonding, heat treatment was performed at 100° C. for 24 hours. It was confirmed that the surface roughness of both wafers before bonding was 0.3 nm or less in Ra. The results showed exactly the same trend as in Example 1. From this result, it was found that the effect of the present invention can be obtained regardless of the initial surface roughness of the LT wafer forming the intervening layer. In the same manner, the same results as in Example 1 were obtained when Si (Ra=175 nm) having a rough surface was used and the same experiment was carried out. In addition, the same results were obtained when intervening layers were provided on a surface where both the LT and Si bonded surfaces were rough. Therefore, it has been found that in the case where an intervening layer is provided between LT and Si, the effect of the present method is not affected even if one or both of the bonded surfaces of LT or Si are not mirror-polished.

Example 9

Ten types of 150 mmΦ Si wafers (thickness: 625 μm) were prepared in the same manner as in Example 1, and 200 nm plasma CVD nitrided (SiN) film was deposited at around room temperature. After deposition, polishing for mirroring was performed. LT wafers having a thickness of 250 μm and a diameter of 150 mmΦ was prepared. Surface activation was performed on both the Si wafer on which the nitride film was deposited and the LT wafer by plasma activation, and both wafers were bonded to each other. After the bonding, heat treatment was performed at 100° C. for 24 hours. It was confirmed that the surface roughness of both wafers before bonding was 0.3 nm or less in Ra. The results showed exactly the same trend as in Example 1. It has been found that this method does not depend on the method of forming the oxide film. Similar results were also obtained when amorphous Si (formed by physical vapor deposition (PVD)), SiON, or the like was deposited on Si wafers. From these results, it has been found that the effect of the present invention can be obtained regardless of the type (material) of the intervening layer. The same result was obtained when the silicon oxide film was formed by spin coating a silicone oil such as perhydropolysilazane or methyltrimethoxysilane.

From the above results, it was found that high mechanical strength and heat resistance (slip resistance and substrate crack resistance) can be achieved by using a Si wafer having an interstitial oxygen concentration of 2 to 10 ppma as a support substrate, and at the same time, deterioration of device characteristics (Q factor) due to dielectric loss can be prevented. It has also been found that there is no dependence on the presence or absence, the type of the intervening layer, the initial surface roughness of the substrate, and the like. Since the Si wafer produced by the CZ method can also be used as a support substrate, it has been found that the problems of mechanical strength and dielectric loss can be solved and low cost can be achieved at the same time.

Although the present embodiment has been described above, the present invention is not limited to these examples. For example, anything obtained by appropriately performing addition, removal or design alteration of a component with respect to the embodiments described above by a person skilled in the art or appropriate combination of the features of each embodiment is included in the range of the present invention as long as containing a gist of the present invention.

REFERENCE SIGNS LIST

1 Composite substrate
10 Support substrate
20 Piezoelectric material substrate
30, 31, 32 Intervening layer

The invention claimed is:

1. A composite substrate manufactured by bonding method comprising sequentially order steps of:
    preparing a piezoelectric material substrate;
    preparing a silicon (Si) wafer having an interstitial oxygen concentration of 2 to 10 parts per million atomic (ppma) as a support substrate;
    bonding the piezoelectric material substrate and the silicon wafer; and
    thinning the piezoelectric material substrate after the bonding to form the composite substrate, wherein the preparing further comprises providing an intervening layer on either or both surfaces of the piezoelectric material substrate and the silicon wafer prior to the bonding;
wherein the composite substrate comprises:
the support substrate consisting of the silicon (Si) wafer having the interstitial oxygen concentration of 2 to 10 parts per million atomic (ppma); and
the piezoelectric material substrate provided on the support substrate.

2. The composite substrate according to claim 1, wherein the piezoelectric material substrate is a lithium tantalate wafer (LT) substrate or a lithium niobate (LN) substrate.

3. The composite substrate according to claim 1, wherein the intervening layer comprises at least one of silicon oxide, silicon nitride, silicon oxynitride (SiON), and amorphous silicon.

4. The composite substrate according to claim 1, wherein the intervening layer is thermally oxidized silica.

5. The composite substrate according to claim 1, wherein at least one surface of the piezoelectric material substrate and the silicon wafer is non-mirror finished.

* * * * *